(12) United States Patent
Khandros et al.

(10) Patent No.: US 7,061,257 B2
(45) Date of Patent: Jun. 13, 2006

(54) PROBE CARD ASSEMBLY

(75) Inventors: Igor Y. Khandros, Orinda, CA (US); A. Nicholas Sporck, Saratoga, CA (US); Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/889,334

(22) Filed: Jul. 12, 2004

(65) Prior Publication Data

US 2005/0035347 A1 Feb. 17, 2005

Related U.S. Application Data

(63) Continuation of application No. 10/458,875, filed on Jun. 10, 2003, now Pat. No. 6,838,893, which is a continuation of application No. 09/042,606, filed on Mar. 16, 1998, now abandoned, and a continuation-in-part of application No. 08/554,902, filed on Nov. 9, 1995, now Pat. No. 5,974,662, which is a continuation-in-part of application No. 08/452,255, filed on May 26, 1995, now Pat. No. 6,336,269, which is a continuation-in-part of application No. 08/340,144, filed on Nov. 15, 1994, now Pat. No. 5,917,707, which is a continuation-in-part of application No. 08/152,812, filed on Nov. 16, 1993, now Pat. No. 5,476,211.

(60) Provisional application No. 60/040,983, filed on Mar. 17, 1997.

(51) Int. Cl.
*G01R 31/02* (2006.01)

(52) U.S. Cl. ........................ 324/754; 324/761; 324/762

(58) Field of Classification Search ........ 324/754–755, 324/761–762, 765; 439/485; 257/723–724; 29/705; 174/251, 254, 256, 260, 267; 361/764, 361/813

See application file for complete search history.

(56) References Cited

U.S. PATENT DOCUMENTS 3,654,585 A  4/1972  Wickersham (Continued)

FOREIGN PATENT DOCUMENTS

EP  632281  1/1995

(Continued)

OTHER PUBLICATIONS

Brown, "Cobra Probe Update," Wentworth Laboraties (Jun. 10, 1996).

(Continued)

*Primary Examiner*—Minh N. Tang
(74) *Attorney, Agent, or Firm*—N. Kenneth Burraston

(57) ABSTRACT

In a probe card assembly, a series of probe elements can be arrayed on a silicon space transformer. The silicon space transformer can be fabricated with an array of primary contacts in a very tight pitch, comparable to the pitch of a semiconductor device. One preferred primary contact is a resilient spring contact. Conductive elements in the space transformer are routed to second contacts at a more relaxed pitch. In one preferred embodiment, the second contacts are suitable for directly attaching a ribbon cable, which in turn can be connected to provide selective connection to each primary contact. The silicon space transformer is mounted in a fixture that provides for resilient connection to a wafer or device to be tested. This fixture can be adjusted to planarize the primary contacts with the plane of a support probe card board.

46 Claims, 5 Drawing Sheets

U.S. PATENT DOCUMENTS

| | | |
|---|---|---|
| 3,826,984 A | 7/1974 | Epple |
| 3,849,728 A | 11/1974 | Evans |
| 4,038,599 A | 7/1977 | Bove et al. |
| 4,480,223 A | 10/1984 | Aigo |
| 4,523,144 A | 6/1985 | Okubo et al. |
| 4,567,432 A | 1/1986 | Buol et al. |
| 4,636,722 A | 1/1987 | Ardezzone |
| 4,764,848 A | 8/1988 | Simpson |
| 4,837,622 A | 6/1989 | Whann et al. |
| 4,841,240 A | 6/1989 | Hsue et al. |
| 4,899,099 A | 2/1990 | Mendenhall et al. |
| 4,965,865 A | 10/1990 | Trenary |
| 4,975,079 A * | 12/1990 | Beaman et al. ............ 439/482 |
| 4,983,907 A | 1/1991 | Crowley |
| 4,983,908 A | 1/1991 | Tada et al. |
| 5,055,778 A | 10/1991 | Okubo et al. |
| 5,070,297 A | 12/1991 | Kwon et al. |
| 5,090,118 A | 2/1992 | Kwon et al. |
| 5,103,557 A | 4/1992 | Leedy |
| 5,124,639 A | 6/1992 | Carlin et al. |
| 5,134,365 A * | 7/1992 | Okubo et al. ............... 324/754 |
| 5,172,050 A | 12/1992 | Swapp |
| 5,177,439 A | 1/1993 | Liu et al. |
| 5,225,777 A | 7/1993 | Bross et al. |
| 5,323,107 A | 6/1994 | D'Souza |
| 5,329,226 A | 7/1994 | Monnet et al. |
| 5,382,898 A | 1/1995 | Subramanian |
| 5,395,253 A | 3/1995 | Crumly |
| 5,399,982 A | 3/1995 | Driller et al. |
| 5,422,574 A | 6/1995 | Kister |
| 5,476,211 A | 12/1995 | Khandros |
| 5,521,518 A | 5/1996 | Higgins |
| 5,534,784 A | 7/1996 | Lum et al. |
| 5,554,940 A | 9/1996 | Hubacher |
| 5,555,422 A | 9/1996 | Nakano |
| 5,563,521 A | 10/1996 | Crumly |
| 5,576,630 A | 11/1996 | Fujita |
| 5,629,631 A | 5/1997 | Perry et al. |
| 5,635,846 A | 6/1997 | Beaman et al. |
| 5,642,054 A | 6/1997 | Pasiecznik, Jr. |
| 5,670,889 A | 9/1997 | Okubo et al. |
| 5,686,842 A | 11/1997 | Lee |
| 5,701,666 A | 12/1997 | DeHaven et al. |
| 5,729,150 A | 3/1998 | Schwindt |
| 5,736,850 A | 4/1998 | Legal |
| 5,764,072 A | 6/1998 | Kister |
| 5,786,701 A | 7/1998 | Pedder |
| 5,806,181 A | 9/1998 | Khandros et al. |
| 5,821,763 A | 10/1998 | Beaman et al. |
| 5,828,226 A | 10/1998 | Higgins et al. |
| 5,829,128 A | 11/1998 | Eldridge et al. |
| 5,917,707 A | 6/1999 | Khandros et al. |
| 5,923,178 A | 7/1999 | Higgins et al. |
| 5,974,662 A | 11/1999 | Eldridge et al. |
| 5,977,783 A | 11/1999 | Takayama et al. |
| 6,023,103 A | 2/2000 | Chang et al. |
| 6,025,730 A | 2/2000 | Akram et al. |
| 6,029,344 A | 2/2000 | Khandros et al. |
| 6,031,282 A | 2/2000 | Jones et al. |
| 6,059,982 A | 5/2000 | Palagonia et al. |
| 6,060,891 A | 5/2000 | Hembree et al. |
| 6,110,823 A | 8/2000 | Eldridge et al. |
| 6,133,744 A | 10/2000 | Yojima et al. |
| 6,174,744 B1 | 1/2001 | Watanabe et al. |
| 6,177,636 B1 | 1/2001 | Fjelstad |
| 6,184,053 B1 | 2/2001 | Eldridge et al. |
| 6,184,576 B1 | 2/2001 | Jones et al. |
| 6,188,231 B1 | 2/2001 | Palagonia |
| 6,351,134 B1 | 2/2002 | Leas et al. |
| 6,838,893 B1 * | 1/2005 | Khandros et al. ........... 324/754 |
| 2001/0054905 A1 | 12/2001 | Khandros et al. |
| 2003/0222667 A1 | 12/2003 | Khandros et al. |

FOREIGN PATENT DOCUMENTS

| | | |
|---|---|---|
| JP | 1-255240 | 1/1989 |
| JP | 3-65659 | 3/1991 |
| JP | 4-240570 | 8/1992 |
| JP | 4-357848 | 12/1992 |
| JP | 5-29406 | 2/1993 |
| JP | 6-50990 | 2/1994 |
| JP | 6-265575 | 9/1994 |
| WO | WO 97/44676 | 11/1997 |
| WO | WO 98/10906 | 1/1998 |

OTHER PUBLICATIONS

Leung et al., "Active Substrate Membrane Probe Card," Center For Integrated Systems, Stanford University (Oct. 12, 1995).

\* cited by examiner

PROBE CARD ASSEMBLY

CROSS-REFERENCE TO RELATED APPLICATIONS

This patent application is a continuation of U.S. patent application Ser. No. 10/458,875, filed Jun. 10, 2003 U.S. Pat. No. 6,838,893, which is a continuation of U.S. patent application Ser. No. 9/042,606, filed Mar. 16, 1998 ABN, which is a nonprovisional of (claims the benefit of) U.S. Provisional Patent Application No. 60/040,983 filed Mar. 17, 1997 by Khandros and Sporck, said U.S. patent application Ser. No. 09/042,606 is a continuation-in-part of commonly-owned, U.S. patent application Ser. No. 08/554,902 filed Nov. 9, 1995 by Eldridge, Grube, Khandros and Mathieu (now U.S. Pat. No. 5,974,662), which is a continuation-in-part of commonly-owned U.S. patent application Ser. No. 08/452,255 (hereinafter "PARENT CASE"), filed 26 May 95 by Eldridge, Grube, Khandros and Mathieu (now U.S. Pat. No. 6,336,269), which is a continuation-in-part of commonly-owned U.S. patent application Ser. No. 08/340,144 filed Nov. 15, 1994 by Khandros and Mathieu (now U.S. Pat. No. 5,917,707), which is a continuation-in-part of commonly-owned U.S. patent application Ser. No. 08/152,812, filed Nov. 16, 1993 by Khandros (status: issued as U.S. Pat. No. 5,476,211).

TECHNICAL FIELD OF THE INVENTION

The invention relates to an apparatus and associated techniques for making pressure connections between electronic components with resilient (spring) contact elements, such as for performing test and burn-in procedures on semiconductor devices prior to their packaging, preferably prior to the individual semiconductor devices being singulated from a semiconductor wafer.

BACKGROUND OF THE INVENTION

The aforementioned commonly-owned, copending U.S. patent application Ser. No. 08/554,902 filed 9 Nov. 1995 and its corresponding PCT Patent Application No. PCT/US95/14844 filed 13 Nov. 95 (WO96/15458, published 23 May 1996), both by ELDRIDGE, GRUBE, KHANDROS and MATHIEU, disclose a probe card assembly. As illustrated, for example, in FIG. 5 therein, the probe card assembly (500) includes a probe card (502), a space transformer (506) having resilient contact structures (probe elements 524) mounted directly to and extending from terminals (522) on a surface thereof, and an interposer (504) disposed between the space transformer (506) and the probe card (502). The space transformer (506) and interposer (504) are "stacked up" so that the orientation of the space transformer (506), hence the orientation of the tips of the probe elements (524), can be adjusted without changing the orientation of the probe card. Suitable mechanisms (532, 536, 538, 546) for adjusting the orientation of the space transformer (506), and for determining what adjustments to make, are disclosed therein. Multiple die sites on a semiconductor wafer (508) are readily probed using the disclosed techniques, and the probe elements (524) can be arranged to optimize probing of an entire wafer (508). As shown, for example, in FIG. 2A therein, the resilient contact structures or probe elements (524) are suitably (but not limited to) composite interconnections elements (200) having a relatively soft core (206) overcoated by a relatively hard shell (218,220).

Generally, the present invention obviates the need for using a space transformer (e.g., 506) and an interposer (504) in a probe card assembly that may be adjusted in a manner similar to that described in the above-referenced patent applications.

Among the problems associated with using a space transformer component in a probe card assembly is that of matching the coefficients of thermal expansion of the space transformer to that of the wafer under test (WUT). Furthermore, in some instances, depending on the materials (e.g., ceramic layers, terminals, etc.) and processes employed in the manufacture of the space transformer component, it can be difficult to achieve a reliable mechanical connection between free-standing resilient (spring) contact elements mounted to the terminals of the space transformer under the stresses encountered when making repeated pressure connections to terminals of other electronic components, such as would be encountered when probing a sequence of WUTs or a series of die sites on a one or more WUTs.

The use of a separate interposer component in a probe card assembly can also be undesirable. Simply stated, it is one more component that must successfully be yielded and incorporated into the probe card assembly.

The present invention advantageously employs, but does not require applicant's own free-standing, resilient, "composite" interconnection elements, which are described in one or more of the above referenced commonly-owned patents and patent applications.

Commonly-owned U.S. patent application Ser. No. 08/152,812 filed 16 Nov. 1993 (now U.S. Pat. No. 4,576,211), and its counterpart commonly-owned copending "divisional" patent applications Ser. No. 08/457,479 filed Jun. 1, 1995 (status: pending) and Ser. No. 08/570,230 filed Dec. 11, 1995 (status: pending), all by KHANDROS, disclose methods for making resilient (spring) interconnection elements for microelectronics applications involving mounting an end of a flexible elongate core element (e.g., wire "stem" or "skeleton") to a terminal on an electronic component coating the flexible core element and adjacent surface of the terminal with a "shell" of one or more materials having a predetermined combination of thickness, yield strength and elastic modulus to ensure predetermined force-to-deflection characteristics of the resulting spring contacts. Exemplary materials for the core element include gold. Exemplary materials for the coating include nickel and its alloys. The resulting spring contact element is suitably used to effect pressure, or demountable, connections between two or more electronic components, including semiconductor devices, and is well-suited to use as a probe element of a probe card assembly.

Commonly-owned, copending U.S. patent application Ser. No. 08/340,144 filed Nov 15, 1994 and its corresponding PCT Patent Application No. PCT/US94/13373 filed Nov. 16, 1994 (WO95/14314, published May 26, 1995), both by KHANDROS and MATHIEU, disclose a number of applications for the aforementioned spring contact elements, and also discloses techniques for fabricating contact pads at the ends of the spring contact elements. For example, in FIG. 14 thereof, a plurality of negative projections or holes, which may be in the form of inverted pyramids ending in apexes, are formed in the surface of a sacrificial layer (substrate). These holes are then filled with a contact structure comprising layers of material such as gold or rhodium and nickel. A flexible elongate element is mounted to the resulting contact structure and can be overcoated in the manner described hereinabove. In a final step, the sacrificial substrate is removed. The resulting spring contact has a contact pad having controlled geometry (e.g., sharp points) at its free end.

Commonly-owned, copending U.S. patent application Ser. No. 08/452,255 filed 26 May 95 and its corresponding PCT Patent Application No. PCT/US95/14909 filed 13 Nov. 95 (WO96/17278, published 6 Jun. 96), both by ELDRIDGE, GRUBE, KHANDROS and MATHIEU, disclose additional techniques and metallurgies for fabricating contact tip structures on sacrificial substrates, as well as techniques for transferring a plurality of spring contact elements mounted thereto, en masse, to terminals of an electronic component (see, e.g., FIGS. 11A–11F and 12A–12C therein). These patent applications also disclose techniques for fabricating free-standing "composite" resilient (spring) contact elements directly on silicon substrates, including on active devices.

Commonly-owned, copending U.S. Provisional Patent Application No. 60/005,189 filed 17 May 96 and its corresponding PCT Patent Application No. PCT/US96/08107 filed 24 May 96 (WO96/37332, published 28 Nov. 96), both by ELDRIDGE, KHANDROS, and MATHIEU, discloses techniques whereby a plurality of contact tip structures (see, e.g, #620 in FIG. 6B therein) are joined to a corresponding plurality of elongate contact elements (see, e.g., #632 in FIG. 6D therein) which are already mounted to an electronic component (#630). This patent application also discloses, for example in FIGS. 7A–7E therein, techniques for fabricating "elongate" contact tip structures in the form of cantilevers. The cantilever tip structures can be tapered, between one end thereof and an opposite end thereof. The cantilever tip structures of this patent application are suitable for mounting to already-existing (i.e., previously fabricated) raised interconnection elements (see, e.g., #730 in FIG. 7F) extending (e.g., free-standing) from corresponding terminals of an electronic component (see. e.g., #734 in FIG. 7F).

Commonly-owned, copending U.S. Provisional Patent Application No. 60/024,555 filed 26 Aug. 96, by ELDRIDGE, KHANDROS and MATHIEU, discloses, for example at FIGS. 2A–2C thereof, a technique whereby a plurality of elongate tip structures having different lengths than one another can be arranged so that their outer ends are disposed at a greater pitch than their inner ends. Their inner, "contact" ends may be collinear with one another, for effecting connections to electronic components having terminals disposed along a line, such as a centerline of the component.

The present invention addresses and is particularly well-suited to making interconnections to modern microelectronic devices having their terminals (bond pads) disposed at a fine-pitch. As used herein, the term "fine-pitch" refers to microelectronic devices that have their terminals disposed at a spacing of less than 5 mils, such as 2.5 mils or 65 μm.

Individual semiconductor (integrated circuit) devices (dies) are typically produced by creating several identical devices on a semiconductor wafer, using know techniques of photolithography, deposition, and the like. Generally, these processes are intended to create a plurality of fully-functional integrated circuit devices, prior to singulating (severing) the individual dies from the semiconductor wafer. In practice, however, certain physical defects in the wafer itself and certain defects in the processing of the wafer inevitably lead to some of the dies being "good" (fully-functional) and some of the dies being "bad" (non-functional).

It is generally desirable to be able to identify which of the plurality of dies on a wafer are good dies prior to their packaging, and preferably prior to their being singulated from the wafer. To this end, a wafer "tester" or "prober" may advantageously be employed to make a plurality of discrete pressure connections to a like plurality of discrete connection pads (bond pads) on the dies. In this manner, the semiconductor dies can be tested and exercised, prior to singulating the dies from the wafer.

A conventional component of a wafer tester is a "probe card" to which a plurality of probe elements are connected tips of the probe elements effecting the pressure connections to the respective bond pads of the semiconductor dies.

Certain difficulties are inherent in any technique for probing semiconductor dies. For example, modern integrated circuits include many thousands of transistor elements requiring many hundreds of bond pads disposed in close proximity to one another (e.g., 5 mils center-to-center). Moreover, the layout of the bond pads need not be limited to single rows of bond pads disposed close to the peripheral edges of the die (See, e.g., U.S. Pat. No. 5,453,583).

To effect reliable pressure connections between the probe elements and the semiconductor die one must be concerned with several parameters including, but not limited to: alignment, probe force, overdrive, contact force, balanced contact force, scrub, contact resistance, and planarization. A general discussion of these parameters may be found in U.S. Pat. No. 4,837,622, entitled HIGH DENSITY PROBE CARD, incorporated by reference herein, which discloses a high density epoxy ring probe card including a unitary printed circuit board having a central opening adapted to receive a pre-formed epoxy ring array of probe elements.

Generally, prior art probe card assemblies include a plurality of tungsten needles extending as cantilevers from a surface of a probe card. The tungsten needles may be mounted in any suitable manner to the probe card, such as by the intermediary of an epoxy ring, as discussed hereinabove. Generally, in any case, the needles are wired to terminals of the probe card through the intermediary of a separate and distinct wire connecting the needles to the terminals of the probe card.

Probe cards are typically formed as circular rings, with hundreds of probe elements (needles) extending from an inner periphery of the ring (and wired to terminals of the probe card). Circuit modules, and conductive traces (lines) of preferably equal length, are associated with each of the probe elements. This ring-shape layout makes it difficult, and in some cases impossible, to probe a plurality of unsingulated semiconductor dies (multiple sites) on a wafer, especially when the bond pads of each semiconductor die are arranged in other than two linear arrays along two opposite edges of the semiconductor die.

Wafer testers may alternately employ a probe membrane having a central contact bump area, as is discussed in U.S. Pat. No. 5,422,574, entitled LARGE SCALE PROTRUSION MEMBRANE FOR SEMICONDUCTOR DEVICES UNDER TEST WITH VERY HIGH PIN COUNTS, incorporated by reference herein. As noted in this patent, "A test system typically comprises a test controller for executing and controlling a series of test programs, a wafer dispensing system for mechanically handling and positioning wafers in preparation for testing and a probe card for maintaining an accurate mechanical contact with the device-under-test (DUT)." (column 1, lines 41–46).

Additional references, incorporated by reference herein, as indicative of the state of the art in testing semiconductor devices, include U.S. Pat. No. 5,442,282 (TESTING AND EXERCISING INDIVIDUAL UNSINGULATED DIES ON A WAFER); U.S. Pat. No. 5,382,898 (HIGH DENSITY PROBE CARD FOR TESTING ELECTRICAL CIR- CUITS); U.S. Pat. No. 5,378,982 TEST PROBE FOR PANEL HAVING AN OVERLYING PROTECTIVE MEMBER ADJACENT PANEL CONTACTS); U.S. Pat. No. 5,339,027 (RIGID-FLEX CIRCUITS WITH RAISED FEATURES AS IC TEST PROBES); U.S. Pat. No. 5,180,977 (MEMBRANE PROBE CONTACT BUMP COMPLIANCY SYSTEM); U.S. Pat. No. 5,066,907 (PROBE SYSTEM FOR DEVICE AND CIRCUIT TESTING); U.S. Pat. No. 4,757,256 (HIGH DENSITY PROBE CARD); U.S. Pat. No. 4,161,692 (PROBE DEVICE FOR INTEGRATED CIRCUIT WAFERS); and U.S. Pat. No. 3,990,689 (ADJUSTABLE HOLDER ASSEMBLY FOR POSITIONING A VACUUM CHUCK).

Generally, interconnections between electronic components can be classified into the two broad categories of "relatively permanent" and "readily demountable".

An example of a "relatively permanent" connection is a solder joint. Once two components are soldered to one another, a process of unsoldering must be used to separate the components. A wire bond is another example of a "relatively permanent" connection.

An example of a "readily demountable" connection is rigid pins of one electronic component being received by resilient socket elements of another electronic component. The socket elements exert a contact force (pressure) on the pins in an amount sufficient to ensure a reliable electrical connection therebetween.

Interconnection elements intended to make pressure contact with terminals of an electronic component are referred to herein as "springs" or "spring elements". Generally, a certain minimum contact force is desired to effect reliable pressure contact to electronic components (e.g., to terminals on electronic components). For example, a contact (load) force of approximately 15 grams (including as little as 2 grams or less and as much as 150 grams or more, per contact) may be desired to ensure that a reliable electrical connection is made to a terminal of an electronic component which may be contaminated with films on its surface, or which has corrosion or oxidation products on its surface. The minimum contact force required of each spring demands either that the yield strength of the spring material or that the size of the spring element are increased. As a general proposition, the higher the yield strength of a material, the more difficult it will be to work with (e.g., punch, bend, etc.). And the desire to make springs smaller essentially rules out making them larger in cross-section.

Probe elements are a class of spring elements of particular relevance to the present invention. Prior art probe elements are commonly fabricated from tungsten, a relatively hard (high yield strength) material. When it is desired to mount such relatively hard materials to terminals of an electronic component, relatively "hostile" (e.g., high temperature) processes such as brazing are required. Such "hostile" processes are generally not desirable (and often not feasible) in the context of certain relatively "fragile" electronic components such as semiconductor devices. In contrast thereto, wire bonding is an example of a relatively "friendly" processes which is much less potentially damaging to fragile electronic components than brazing. Soldering is another example of a relatively "friendly" process. However, both solder and gold are relatively soft (low yield strength) materials which will not function well as spring elements.

A subtle problem associated with interconnection elements, including spring contact elements, is that, often, the terminals of an electronic component are not perfectly coplanar. Interconnection elements lacking in some mechanism incorporated therewith for accommodating these "tolerances" (gross non-planarities) will be hard pressed to make consistent contact pressure contact with the terminals of the electronic component.

The following U.S. patents, incorporated by reference herein, are cited as being of general interest vis-a-vis making connections, particularly pressure connections, to electronic components: U.S. Pat. No. 5,386,344 (FLEX CIRCUIT CARD ELASTOMERIC CABLE CONNECTOR ASSEMBLY); U.S. Pat. No. 5,336,380 (SPRING BIASED TAPERED CONTACT ELEMENTS FOR ELECTRICAL CONNECTORS AND INTEGRATED CIRCUIT PACKAGES); U.S. Pat. No. 5,317,479 (PLATED COMPLIANT LEAD); U.S. Pat. No. 5,086,337 (CONNECTING STRUCTURE OF ELECTRONIC PART AND ELECTRONIC DEVICE USING THE STRUCTURE); U.S. Pat. No. 5,067,007 (SEMICONDUCTOR DEVICE HAVING LEADS FOR MOUNTING TO A SURFACE OF A PRINTED CIRCUIT BOARD); U.S. Pat. No. 4,989,069 (SEMICONDUCTOR PACKAGE HAVING LEADS THAT BREAKAWAY FROM SUPPORTS); U.S. Pat. No. 4,893,172 (CONNECTING STRUCTURE FOR ELECTRONIC PART AND METHOD OF MANUFACTURING THE SAME); U.S. Pat. No. 4,793,814 (ELECTRICAL CIRCUIT BOARD INTERCONNECT); U.S. Pat. No. 4,777,564 (LEADFORM FOR USE WITH SURFACE MOUNTED COMPONENTS); U.S. Pat. No. 4,764,848 (SURFACE MOUNTED ARRAY STRAIN RELIEF DEVICE); U.S. Pat. No. 4,667,219 (SEMICONDUCTOR CHIP INTERFACE); U.S. Pat. No. 4,642,889 (COMPLIANT INTERCONNECTION AND METHOD THEREFOR); U.S. Pat. No. 4,330,165 (PRESS-CONTACT TYPE INTERCONNECTORS); U.S. Pat. No. 4,295,700 (INTERCONNECTORS); U.S. Pat. No. 4,067,104 (METHOD OF FABRICATING AN ARRAY OF FLEXIBLE METALLIC INTERCONNECTS FOR COUPLING MICROELECTRONICS COMPONENTS); U.S. Pat. No. 3,795,037 (ELECTRICAL CONNECTOR DEVICES); U.S. Pat. No. 3,616,532 (MULTILAYER PRINTED CIRCUIT ELECTRICAL INTERCONNECTION DEVICE); and U.S. Pat. No. 3,509,270 (INTERCONNECTION FOR PRINTED CIRCUITS AND METHOD OF MAKING SAME).

BRIEF DESCRIPTION (SUMMARY) OF THE INVENTION

It is an object of the present invention to provide an improved probe card assembly.

It is an object of the present invention to provide a technique for probing semiconductor devices, particularly while they are resident on a semiconductor wafer.

It is another object of the present invention to provide a technique for probing semiconductor devices that allows the tips of the probe elements to be oriented without changing the position of the probe card.

According to the invention, a probe card assembly includes:

a probe card component such as a printed circuit board (PCB);

an interconnection substrate such as a silicon substrate or wafer supported above a surface of the probe card;

a plurality of resilient (spring) contact (probe) elements mounted to and extending from a first plurality of terminals (e.g., bond pads) on the interconnection substrate;

means for making electrical connections to the probe elements via the silicon substrate, such as a second plurality of terminals on the silicon substrate which can be connected to with a flexible (ribbon) cable; and means for adjusting the orientation of the interconnection substrate relative to the probe card such as mounting plates and differential screws or electrical actuators.

Together, the interconnection substrate and probe elements comprise a "probe card insert" which can be manufactured and sold as a unit for incorporation by others into a probe card assembly.

The probe card component, probe card insert, ribbon cable and means for adjusting the orientation of the interconnection substrate can be manufactured and sold as a kit, for assembly by others into a complete probe card assembly.

Generally, the silicon space transformer component permits a plurality of resilient contact structures extending from its top surface to make contact with terminals of an electronic component (i.e., bond pads on semiconductor devices) at a relatively fine pitch (spacing), while connections to the space transformer (i.e., to the bond pads or, alternatively, resilient contact structures) on its bottom surface are effected at a relatively coarser pitch.

According to an aspect of the invention, the space transformer and interposer components of the probe card assembly may be provided as a "kit", adapted for use with a probe card. Optionally, the mechanism for adjusting the orientation of the space transformer can be included in the "kit".

According to an aspect of the invention, the resilient contact structures (probe elements) extending from the top surface of the silicon space transformer component may (or may not) be "composite interconnection elements" (defined hereinbelow).

According to an aspect of the invention, the resilient contact structures extending from the top and bottom surfaces of the interposer component are "composite interconnection elements" (defined hereinbelow).

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

Certain elements in selected ones of the drawings are illustrated not-to-scale, for illustrative clarity. Often, similar elements throughout the drawings are referred to by similar reference numerals. For example, the element 199 may be similar in many respects to the element 299 in another figure. Also, often, similar elements are referred to with similar numbers in a single drawing. For example, a plurality of elements 199 may be referred to as 199a, 199b, 199c, etc.

DETAILED DESCRIPTION OF THE INVENTION

Figure 1:
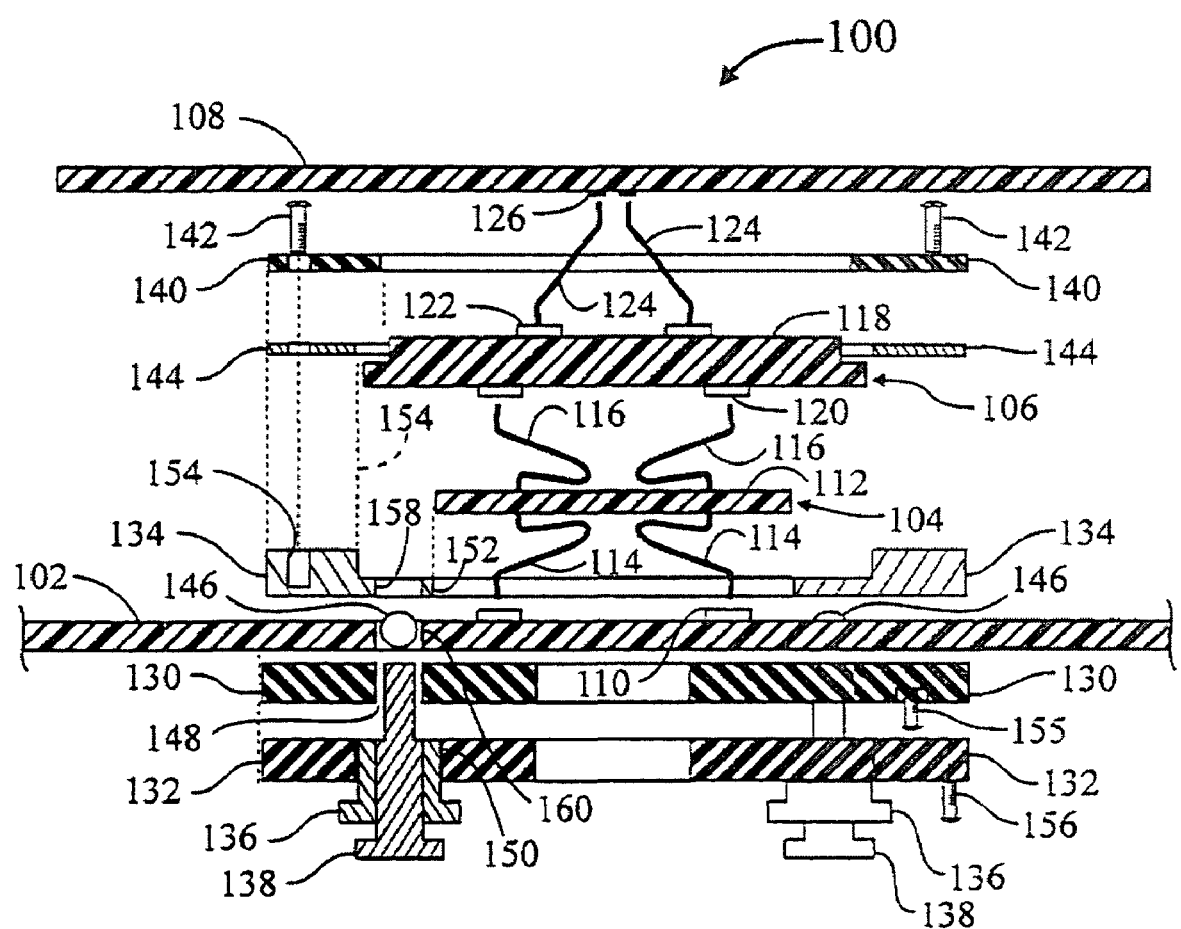
FIG. 1 is an exploded view, partially in cross-section, of a probe card assembly such as is disclosed in the aforementioned U.S. patent application Ser. No. 08/554,902 and its counterpart PCT/US95/14844, and illustrates certain techniques which are relevant to the present invention.

This patent application is directed to probe card assemblies, components thereof, and methods of using same. As will be evident from the description that follows, the use of resilient (spring) contact structures to effect pressure connections to terminals of an electronic component is essential. The resilient contact structures are suitably (but not necessarily) implemented as "composite interconnection elements", such as have been described in the disclosure of the aforementioned U.S. patent application Ser. No. 08/452,255 ("PARENT CASE"), incorporated by reference herein.

According to an aspect of the invention, the probe elements (resilient contact structures extending from the top surface of the space transformer component) are preferably formed as "composite interconnection elements" which are fabricated directly upon the terminals of the space transformer component of the probe card assembly. The "composite" (multilayer) interconnection element is fabricated by mounting an elongate element ("core") to an electronic component, shaping the core to have a spring shape, and overcoating the core to enhance the physical (e.g., spring) characteristics of the resulting composite interconnection element and/or to securely anchor the resulting composite interconnection element to the electronic component. The resilient contact structures of the interposer component may also be formed as composite interconnection elements.

The use of the term "composite", throughout the description set forth herein, is consistent with a 'generic' meaning of the term (e.g., formed of two or more elements), and is not to be confused with any usage of the term "composite" in other fields of endeavor, for example, as it may be applied to materials such as glass, carbon or other fibers supported in a matrix of resin or the like.

As used herein, the term "spring shape" refers to virtually any shape of an elongate element which will exhibit elastic (restorative) movement of an end (tip) of the elongate element with respect to a force applied to the tip. This includes elongate elements shaped to have one or more bends, as well as substantially straight elongate elements.

As used herein, the terms "contact area", "terminal", "pad", and the like refer to any conductive area on any electronic component to which an interconnection element is mounted or makes contact.

In an embodiment of the invention, the probe elements are composite interconnection elements comprising a core of a "soft" material having a relatively low yield strength which is overcoated with a "hard" material having a relatively high yield strength. For example, a soft material such as a gold wire is attached (e.g., by wire bonding) to a bond pad of a semiconductor device and is overcoated (e.g., by electrochemical plating) with a hard material such nickel and its alloys.

Vis-a-vis overcoating the core, single and multi-layer overcoatings, "rough" overcoatings having microprotrusions (see also FIGS. 5C and 5D of the PARENT CASE), and overcoatings extending the entire length of or only a portion of the length of the core, are described. In the latter case, the tip of the core may suitably be exposed for making contact to an electronic component (see also FIG. 5B of the PARENT CASE).

Generally, throughout the description set forth herein, the term "plating" is used as exemplary of a number of techniques for overcoating the core. It is within the scope of this invention that the core can be overcoated by any suitable technique including, but not limited to: various processes involving deposition of materials out of aqueous solutions; electrolytic plating; electroless plating; chemical vapor deposition (CVD); physical vapor deposition (PVD); processes causing the deposition of materials through induced disintegration of liquid or solid precursors; and the like, all of these techniques for depositing materials being generally well known.

Generally, for overcoating the core with a metallic material such as nickel, electrochemical processes are preferred, especially electrolytic plating.

In another embodiment of the invention, the core is an elongate element of a "hard" material, inherently suitable to functioning as a spring element, and is mounted at one end to a terminal of an electronic component. The core, and at least an adjacent area of the terminal, is preferably overcoated with a material which will enhance anchoring the core to the terminal. In this manner, it is not necessary that the core be well-mounted to the terminal prior to overcoating, and processes which are less potentially damaging to the electronic component may be employed to "tack" the core in place for subsequent overcoating. These "friendly" processes include soldering, gluing, and piercing an end of the hard core into a soft portion of the terminal.

Preferably, the core is in the form of a wire.

Alternatively, the core is in the form of a ribbon.

Representative materials, both for the core and for the overcoatings, are disclosed.

In the main hereinafter, techniques involving beginning with a relatively soft (low yield strength) core, which is generally of very small dimension (e.g., 3.0 mil or less) are described. Soft materials, such as gold, which attach easily to semiconductor devices, generally lack sufficient resiliency to function as springs. (Such soft, metallic materials exhibit primarily plastic, rather than elastic deformation.) Other soft materials which may attach easily to semiconductor devices and possess appropriate resiliency are often electrically non-conductive, as in the case of most elastomeric materials. In either case, desired structural and electrical characteristics can be imparted to the resulting composite interconnection element by the overcoating applied over the core. The resulting composite interconnection element can be made very small, yet can exhibit appropriate contact forces. Moreover, a plurality of such composite interconnection elements can be arranged at a fine pitch (e.g., 10 mils), even though they have a length (e.g., 100 mils) which is much greater than the distance to a neighboring composite interconnection element (the distance between neighboring interconnection elements being termed "pitch").

It is within the scope of this invention that composite interconnection elements can be fabricated on a microminiature scale, for example as small springs for connectors and sockets, having cross-sectional dimensions on the order of twenty-five microns (μm), or less. This ability to manufacture reliable interconnection having dimensions measured in microns, rather than mils, squarely addresses the evolving needs of existing interconnection technology and future area array technology.

The composite interconnection elements of the present invention exhibit superior electrical characteristics, including electrical conductivity, solderability and low contact resistance. In many cases, deflection of the interconnection element in response to applied contact forces results in a "wiping" contact, which helps ensure that a reliable contact is made.

An additional advantage of the present invention is that connections made with the interconnection elements of the present invention are readily demountable. Soldering, to effect the interconnection to a terminal of an electronic component is optional, but is generally not preferred at a system level.

According to an aspect of the invention, techniques are described for making interconnection elements having controlled impedance. These techniques generally involve coating (e.g., electrophoretically) a conductive core or an entire composite interconnection element with a dielectric material (insulating layer), and overcoating the dielectric material with an outer layer of a conductive material. By grounding the outer conductive material layer, the resulting interconnection element can effectively be shielded, and its impedance can readily be controlled. (See also FIG. 10K of the PARENT CASE.)

According to an aspect of the invention, interconnection elements can be pre-fabricated as individual units, for later attachment to electronic components. Various techniques for accomplishing this objective are set forth herein. Although not specifically covered in this document, it is deemed to be relatively straightforward to fabricate a machine that will handle the mounting of a plurality of individual interconnection elements to a substrate or, alternatively, suspending a plurality of individual interconnection elements in an elastomer, or on a support substrate.

It should clearly be understood that the composite interconnection element of the present invention differs dramatically from interconnection elements of the prior art which have been coated to enhance their electrical conductivity characteristics or to enhance their resistance to corrosion.

The overcoating of the present invention is specifically intended to substantially enhance anchoring of the interconnection element to a terminal of an electronic component and/or to impart desired resilient characteristics to the resulting composite interconnection element. Stresses (contact forces) are directed to portions of the interconnection elements which are specifically intended to absorb the stresses.

It should also be appreciated that the present invention provides essentially a new technique for making spring structures. Generally, the operative structure of the resulting spring is a product of plating, rather than of bending and shaping. This opens the door to using a wide variety of materials to establish the spring shape, and a variety of "friendly" processes for attaching the "falsework" of the core to electronic components. The overcoating functions as a "superstructure" over the "falsework" of the core, both of which terms have their origins in the field of civil engineering.

A distinct advantage of the present invention is that probe elements (resilient contact structures) can be fabricated directly on terminals of a space transformer substrate component of a probe card assembly without requiring additional materials, such as brazing or soldering.

According to an aspect of the invention, any of the resilient contact structures may be formed as at least two composite interconnection elements.

A Probe Card Assembly

The aforementioned U.S. patent application Ser. No. 08/554,902 and its counterpart PCT/US95/14844 disclose a probe card assembly. FIG. 1 of this patent application corresponds generally to FIG. 5 of those applications.

FIG. 1 illustrates an embodiment of a probe card assembly 100 which includes as its major functional components a probe card 102, an interposer 104 and a space transformer 106, and which is suitable in use for making temporary (pressure) electrical connections to a semiconductor wafer 108. In this exploded, cross-sectional view, certain elements of certain components are shown exaggerated, for illustrative clarity. However, the vertical (as shown) alignment of the various components is properly indicated by the dashed lines in the figure. It should be noted that the interconnection elements (114, 116, 124, discussed in greater detail hereinbelow) are shown in full, rather than in section.

The probe card component 102 is generally a conventional circuit board substrate having a plurality (two of many shown) of contact areas (terminals) 110 disposed on the top (as viewed) surface thereof. Additional components (not shown) may be mounted to the probe card, such as active and passive electronic components, connectors, and the like. The terminals 110 on the circuit board may typically be arranged at a 100 mil pitch. The probe card 102 is suitably round, having a diameter on the order of 12 inches.

The interposer 104 includes a circuitized substrate 112. In the manner described hereinabove, a plurality (two of many shown) of resilient (spring) interconnection elements 114 are mounted (by their proximal ends) to and extend downward (as viewed) from the bottom (as viewed) surface of the substrate 112, and a corresponding plurality (two of many shown) of resilient interconnection elements 116 are mounted (by their proximal ends) to and extend upward (as viewed) from the top (as viewed) surface of the substrate 112. The spring elements 114 are interconnected (not shown) to the spring elements 116 in a conventional manner through the substrate 112.

Any of the spring shapes disclosed in any of the aforementioned commonly-owned patents and patent applications are suitable for use as the resilient interconnection elements 114 and 116, and they may be implemented as "composite interconnection elements". As a general proposition, the tips (distal ends) of both the lower plurality 114 and of the upper plurality 116 of interconnection elements 114 and 116 are at a pitch which matches that of the terminals 110 of the probe card component 102, for example 100 mils.

The interconnection elements 114 and 116 are illustrated with exaggerated scale, for illustrative clarity. Typically, the interconnection elements 114 and 116 would extend to an overall height of 20–100 mils from respective bottom and top surfaces of the interposer substrate 112. Generally, the height of the interconnection elements is dictated by the amount of compliance desired.

The space transformer component 106 includes a suitable circuitized substrate 118 such as a multi-layer ceramic substrate having a plurality (two of many shown) of terminals (contact areas, pads) 120 disposed on the lower (as viewed) surface thereof and a plurality (two of many shown) of terminals (contact areas, pads) 122 disposed on the upper (as viewed) surface thereof. In this example, the lower plurality of contact pads 120 is disposed at the pitch of the tips of the interconnection elements 116 (e.g., 100 mils), and the upper plurality of contact pads 122 is disposed at a finer (closer) pitch (e.g., 50 mils).

A plurality (two of many shown) of resilient (spring) interconnection elements 124 (also referred to as "probes" or "probe elements") are mounted (by their proximal ends) to the terminals 122 and extend upward (as viewed) from the top (as viewed) surface of the space transformer substrate 118. As illustrated, these probe elements 124 are suitably arranged so that their tips (distal ends) are spaced at an even finer pitch (e.g., 10 mils) than their proximal ends, thereby augmenting the pitch reduction of the space transformer 106. These resilient contact structures (interconnection elements) 124 are preferably, but not necessarily, the aforementioned "composite interconnection elements".

It is within the scope of the invention that the probe elements (124) can be fabricated on a sacrificial substrate and subsequently mounted to the terminals (122) of the space transformer component (106), in the manner discussed in the aforementioned commonly-owned U.S. patent application Ser. No. 08/788,740 and its counterpart PCT/US96/08107.

As is known, a semiconductor wafer 108 includes a plurality of die sites (not shown) formed by photolithography, deposition, diffusion, and the like, on its front (lower, as viewed) surface. Typically, these die sites are fabricated to be identical to one another. However, as is known, flaws in either the wafer itself or in any of the processes to which the wafer is subjected to form the die sites, can result in certain die sites being non-functional, according to well established test criteria. Often, due to the difficulties attendant probing die sites prior to singulating semiconductor dies from a semiconductor wafer, testing is performed after singulating and packaging the semiconductor dies. When a flaw is discovered after packaging the semiconductor die, the net loss is exacerbated by the costs attendant to packaging the die. Semiconductor wafers typically have a diameter of at least 6 inches, including at least 8 inches.

Each die site typically has a number of contact areas (e.g., bond pads), which may be disposed at any location and in any pattern on the surface of the die site. Two (of many) bond pads 126 of a one of the die sites are illustrated in the figure.

A limited number of techniques are known for testing the die sites, prior to singulating the die sites into individual semiconductor dies. A representative prior art technique involves fabricating a probe card insert having a plurality of tungsten "needles" embedded in and extending from a ceramic substrate, each needle making a temporary connection to a given one of the bond pads. Such probe card inserts are expensive and somewhat complex to manufacture, resulting in their relatively high cost and in a significant lead time to obtain. Given the wide variety of bond pad arrangements that are possible in semiconductor dies, each unique arrangement requires a distinct probe card insert.

The rapidity with which unique semiconductor dies are manufactured highlights the urgent need for probe card inserts that are simple and inexpensive to manufacture, with a short turnaround time. The use of a space transformer (106) having resilient (spring) contact elements (124) mounted thereto and extending therefrom as a probe card insert addresses this need.

In use, the interposer 104 is disposed on the top (as viewed) surface of the probe card 102, and the space transformer 106 is stacked atop (as viewed) the interposer 104 so that the interconnection elements 114 make a reliable pressure contact with the contact terminals 110 of the probe card 102, and so that the interconnection elements 116 make a reliable pressure contact with the contact pads 120 of the space transformer 106. Any suitable mechanism for stacking these components and for ensuring such reliable pressure contacts may be employed, a suitable one of which is described hereinbelow.

The probe card assembly 100 includes the following major components for stacking the interposer 106 and the space transformer 106 onto the probe card 102:

a rear mounting plate 130 made of a rigid material such as stainless steel, an actuator mounting plate 132 made of a rigid material such as stainless steel, a front mounting plate 134 made of a rigid material such as stainless steel, a plurality (two of many shown, three is preferred) of differential screws including an outer differential screw element 136 and an inner differential screw element 138, a mounting ring 140 which is preferably made of a springy material such as phosphor bronze and which has a pattern of springy tabs (not shown) extending therefrom, a plurality (two of many shown) of screws 142 for holding the mounting ring 138 to the front mounting plate 134 with the space transformer 106 captured therebetween, optionally, a spacer ring 144 disposed between the mounting ring 140 and the space transformer 106 to accommodate manufacturing tolerances, and a plurality (two of many shown) of pivot spheres 146 disposed atop (as viewed) the differential screws (e.g., atop the inner differential screw element 138).

The rear mounting plate 130 is a metal plate or ring (shown as a ring) disposed on the bottom (as shown) surface of the probe card 102. A plurality (one of many shown) of holes 148 extend through the rear mounting plate.

The actuator mounting plate 132 is a metal plate or ring (shown as a ring) disposed on the bottom (as shown) surface of the rear mounting plate 130. A plurality (one of many shown) of holes 110 extend through the actuator mounting plate. In use, the actuator mounting plate 132 is affixed to the rear mounting plate 130 in any suitable manner, such as with screws (omitted from the figure for illustrative clarity).

The front mounting plate 134 is a rigid, preferably metal ring. In use, the front mounting plate 134 is affixed to the rear mounting plate 130 in any suitable manner, such as with screws (omitted from the figure for illustrative clarity) extending through corresponding holes (omitted from the figure for illustrative clarity) through the probe card 102, thereby capturing the probe card 102 securely between the front mounting plate 134 and rear mounting plate 130.

The front mounting plate 134 has a flat bottom (as viewed) surface disposed against the top (as viewed) surface of the probe card 102. The front mounting plate 134 has a large central opening therethrough, defined by an inner edge 112 the thereof, which is sized to permit the plurality of contact terminals 110 of the probe card 102 to reside within the central opening of the front mounting plate 134, as shown.

As mentioned, the front mounting plate 134 is a ring-like structure having a flat bottom (as viewed) surface. The top (as viewed) surface of the front mounting plate 134 is stepped, the front mounting plate being thicker (vertical extent, as viewed) in an outer region thereof than in an inner region thereof. The step, or shoulder is located at the position of the dashed line (labelled 114), and is sized to permit the space transformer 106 to clear the outer region of the front mounting plate and rest upon the inner region of the front mounting plate 134 (although, as will be seen, the space transformer actually rests upon the pivot spheres 146).

A plurality (one of many shown) of holes 114 extend into the outer region of the front mounting plate 134 from the top (as viewed) surface thereof at least partially through the front mounting plate 134 (these holes are shown extending only partially through the front mounting plate 134 in the figure) which, as will be seen, receive the ends of a corresponding plurality of the screws 142. To this end, the holes 114 are threaded holes. This permits the space transformer 106 to be secured to the front mounting plate by the mounting ring 140, hence urged against the probe card 102.

A plurality (one of many shown) of holes 118 extend completely through the thinner, inner region of the front mounting plate 134, and are aligned with a plurality (one of many shown) of corresponding holes 160 extending through the probe card 102 which, in turn, are aligned with the holes 148 in the rear mounting plate and the holes 110 in the actuator mounting plate 138.

The pivot spheres 146 are loosely disposed within the aligned holes 118 and 160, at the top (as viewed) end of the inner differential screw elements 138. The outer differential screw elements 136 thread into the (threaded) holes 110 of the actuator mounting plate 132, and the inner differential screw elements 138 thread into a threaded bore of the outer differential screw elements 136. In this manner, very fine adjustments can be made in the positions of the individual pivot spheres 146. For example, the outer differential screw elements 136 have an external thread of 72 threads-per-inch, and the inner differential screw elements 138 have an external thread of 80 threads-per inch. By advancing an outer differential screw element 136 one turn into the actuator mounting plate 132 and by holding the corresponding inner differential screw element 138 stationary (with respect to the actuator mounting plate 132), the net change in the position of the corresponding pivot sphere 146 will be 'plus' $\frac{1}{72}$ (0.0139) 'minus' $\frac{1}{80}$ (0.0125) inches, or 0.0014 inches. This permits facile and precise adjustment of the planarity of the space transformer 106 vis-a-vis the probe card 102. Hence, the positions of the tips (top ends, as viewed) of the probes (interconnection elements) 124 can be changed, without changing the orientation of the probe card 102. The importance of this feature, a technique for performing alignment of the tips of the probes, and alternate mechanisms (means) for adjusting the planarity of the space transformer are discussed in greater detail hereinbelow. Evidently, the interposer 104 ensures that electrical connections are maintained between the space transformer 106 and the probe card 102 throughout the space transformer's range of adjustment, by virtue of the resilient or compliant contact structures disposed on the two surfaces of the interposer.

The probe card assembly 100 is simply assembled by placing the interposer 104 within the opening 112 of the front mounting plate 134 so that the tips of the interconnection elements 114 contact the contact terminals 110 of the probe card 102, placing the space transformer 106 on top of the interposer 104 so that the tips of the interconnection elements 116 contact the contact pads 120 of the space transformer 106, optionally placing a spacer 144 atop the space transformer 106, placing the mounting ring 140 over the spacer 144, and inserting the screws 142 through the mounting ring 140 through the spacer 144 and into the holes 114 of the front mounting plate 134, and mounting this "subassembly" to the probe card 102 by inserting screws (one shown partially as 155) through the rear mounting plate 130 and through the probe card 102 into threaded holes (not shown) in the bottom (as viewed) surface of the front mounting plate 134. The actuator mounting plate 138 can then be assembled (e.g., with screws, on of which is shown partially as 156) to the rear mounting plate 130, pivot spheres 160 dropped into the holes 150 of the actuator mounting plate 132, and the differential screw elements 136 and 138 inserted into the holes 150 of the actuator mounting plate 132.

In this manner, a probe card assembly is provided having a plurality of resilient contact structures (124) extending therefrom for making contact with a plurality of bond pads (contact areas) on semiconductor dies, prior to their singulation from a semiconductor wafer, at a fine pitch which is commensurate with today's bond pad spacing. Generally, in use, the assembly 100 would be employed upside down from what is shown in the figure, with the semiconductor wafer being pushed (by external mechanisms, not shown) up onto the tips of the resilient contact structures (124).

As is evident from the figure, the front mounting plate (baseplate) 134 determines the position of the interposer 104 vis-a-vis the probe card 102. To ensure accurate positioning of the front mounting plate 134 vis-a-vis the probe card 102, a plurality of alignment features (omitted from the figure for illustrative clarity) such as pins extending from the front mounting plate) and holes extending into the probe card 102 may be provided.

It is within the scope of this invention that any suitable resilient contact structures (114, 116, 124) be employed on the interposer (104) and/or the space transformer (106), including tabs (ribbons) of phosphor bronze material or the like brazed or soldered to contact areas on the respective interposer or space transformer.

It is within the scope of this invention that the interposer (104) and the space transformer (106) can be pre-assembled with one another, such as with spring clips which are described as element 486 of FIG. 29 of the aforementioned copending, commonly-owned PCT/US94/13373, extending from the interposer substrate.

It is within the scope of this invention that the interposer (104) be omitted, and in its stead, a plurality of resilient contact structures comparable to 114 be mounted directly to the contact pads (120) on the lower surface of the space transformer. However, achieving coplanarity between the probe card and the space transformer would be difficult. A principal function of the interposer is to provide compliance to ensure such coplanarity.

As illustrated in FIGS. 5A and 5B of the aforementioned U.S. patent application Ser. No. 08/554,902 and its counterpart PCT/US95/14844, the top (as viewed in FIG. 5 therein, or in FIG. 1 herein) can be provided with a plurality of terminals to which spring contact elements are mounted in a pattern that corresponds a single semiconductor die or to a plurality (e.g., four or more) semiconductor dies which are resident on a semiconductor wafer.

Aligning the Probe Card Assembly

Figure 2:
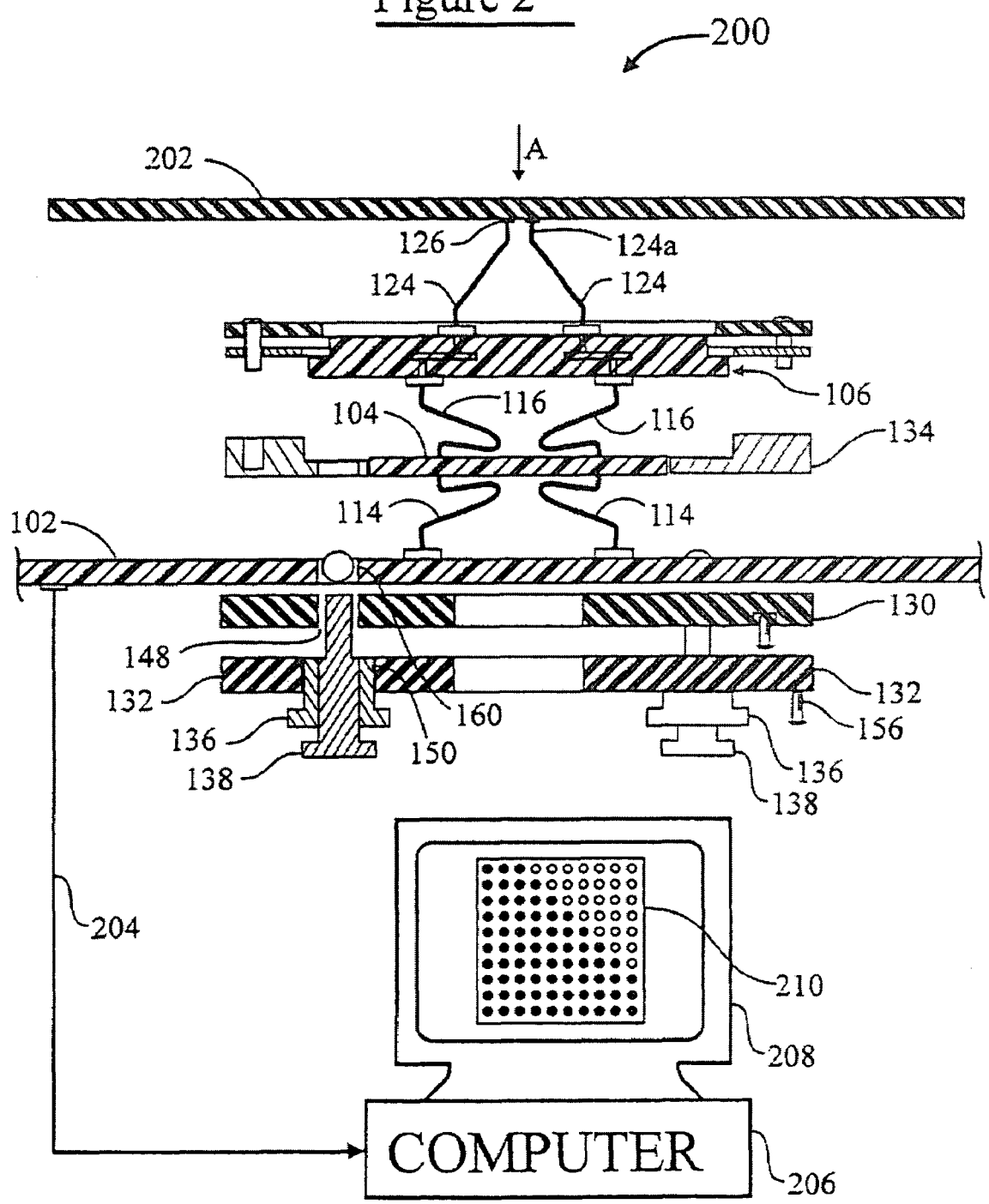
FIG. 2 is a view, partially in cross-section, and partially-schematic, of a probe card assembly similar to the probe card assembly illustrated in FIG. 1 being aligned for use in testing semiconductor wafers, such as is disclosed in the aforemetioned U.S. patent application Ser. No. 08/554,902 and its counterpart PCT/US95/14844, and illustrates certain techniques which are relevant to the present invention.

The aforementioned U.S. patent application Ser. No. 08/554,902 and its counterpart PCT/US95/14844 disclose a technique for aligning thee probe card assembly. FIG. 2 of this patent application (corresponds generally to FIG. 7 of those applications.

FIG. 2 illustrates a technique 200 of aligning a probe card assembly such as the probe card assembly 100 of FIG. 1. The view of FIG. 2 is partially assembled, with the major components in contact with one another.

A problem addressed head on by this invention is that it is often difficult to align the contact tips of a probe card (or probe card insert) with respect to a semiconductor wafer being tested. It is essential that tolerances on the coplanarity of the tips of the probes and the surface of the wafer be held to a minimum, to ensure uniform reliable contact pressure at each the tip 124a (top ends, as viewed) of each probe (i.e, the resilient contact structures 124). As discussed hereinabove, a mechanism (e.g., differential screws 136 and 138) is provided in the probe card assembly for adjusting the planarity of the tips 124a of the probes by acting upon the space transformer 106. In this figure, the space transformer substrate 106 is illustrated with internal connection between the top terminals and the bottom terminals thereof.

Prior to employing the probe card assembly to perform testing on a semiconductor wafer, the alignment of the probe tips is measured and, if necessary, adjusted to ensure that the probe tips 124a will be coplanar with semiconductor wafers that are subsequently presented to the probe card assembly (i.e., urged against the probe tips).

Generally, a wafer tester (not shown) in which the probe card assembly is mounted, will have a mechanism (not shown) for conveying semiconductor wafers into the region of the probe card assembly and urging the semiconductor wafers against the probe tips 124a. To this end, semiconductor wafers are held by a chuck mechanism (not shown). For purposes of this discussion, it is assumed that the tester and chuck mechanism are capable of moving wafer-after-wafer into a precise, repeatable location and orientation—the precise location of the wafer functioning as a "reference plane".

According to the invention, in order to align the tips 524a vis-a-vis the expected orientation of a semiconductor wafer, in other words vis-a-vis the reference plane, a flat electrically-conductive metal plate 202 is mounted in the tester in lieu of a semiconductor wafer. The flat metal plate 202 functions as an "ersatz" or "virtual" wafer, for purposes of aligning the tips 124a of the probe elements 124.

Each probe element 124 is associated with a one of a plurality of terminals (not shown) on the probe card 102, a conductive path therebetween being constituted by a selected one of the probe elements 124, an associated selected one of the resilient contact structures 116 and an associated selected one of the resilient contact structures 114, and wiring layers (not shown) within the probe card 102. The probe card terminals may be in the form of surface terminals, terminals of a socket, or the like. A cable 204 connects between the probe card 102 and a computer (tester) 206 which has a display monitor 208. The present invention is not limited to using a computing device, nor to a display monitor.

In this example, it is assumed that one hundred pressure contacts are sought to be effected between one hundred probe tips 124a arranged in a 10×10 rectangular array and one hundred terminals (e.g., bond pads) of a semiconductor wafer. The present invention is not, however, limited to any particular number of probe tips or any particular layout of bond pads.

The flat metal plate 202 is carried by the chuck (not shown) and urged (advanced, as indicated by the arrow labelled "A") against the probe tips 124a. This is done in a relatively gradual manner, so that it can be ascertained whether the probe tips 124a all contact the flat metal plate in unison (not likely), or whether certain ones of the probe tips 124*a* are contacted by the flat metal plate 202 prior to remaining ones of the probe tips 124*a*. In the illustration, the seventy-one filled circles (dots) within the area 210 on the monitor 208 indicate that seventy-one of the probe tips 124*a* have been contacted by the flat metal plate 202 prior to the remaining twenty-nine of the probe tips 124*a* (illustrated as empty circles) having been contacted by the flat metal plate 202. Based on this visual representation, it is evident that the space transformer 106 (or, possibly, the metal plate 202) is tilted (canted) to the left (as viewed) downwards (out of the page, as viewed), and the orientation of the space transformer 506 can readily be adjusted by suitable adjustments of the differential screws 136 and 138.

The adjustments necessary to achieve the desired goal of planar, simultaneous contact of all of the tips 124*a* with the flat metal plate 202, without altering the orientation of the probe card 1502, so that all of the probe tips 124*a* make substantially simultaneous contact with the flat metal plate 202 are readily calculated, either on-line or off-line. By making the calculated adjustments, the tips 124*a* of the probes 124 will subsequently make substantially simultaneous contact with bond pads on semiconductor wafers being tested.

The "go/no-go" (contact/no contact) type of testing discussed in the previous paragraph is illustrative of a first "order" of alignment that is facilitated by the probe card assembly of the present invention. A second "order" of alignment is readily performed by recording (e.g., in the computer memory) the sequence (order) in which the probe element tips contact the metal plate. The first tip to contact the metal plate generally will generally represent a corner of the space transformer that is too "high", and needs to be lowered (e.g., by adjusting the differential screws). Likewise, the last tip to contact the metal plate will generally represent a corner of the space transformer that is too "low", and needs to be heightened (e.g., by adjusting the differential screws). It is within the scope of this invention that any suitable algorithm can be employed to determine the adjustments required to be made, based on the sequence of tips contacting the metal plate. It is also within the scope of this invention that a resistance (e.g., to ground) between each probe tip 124*a* and the flat metal plate 202 can be measured and displayed as a numeral, or symbol, or dot color, or the like, indicative of the measured resistance, rather than merely as a filled circle versus an unfilled circle on the display monitor, although such is generally not preferred.

It is within the scope of this invention that any suitable mechanism can be employed for adjusting the orientation of the space transformer 106—in other words, planarizing the tips 124*a* of probe elements 124. Alternatives to using the differential screws (136, 138) arrangement discussed hereinabove would be to use servo mechanisms, piezoelectric drivers or actuators, magnetostrictive devices, combinations thereof (e.g., for gross and fine adjustments), or the like to accomplish such planarizing.

feedback and Automatic Planarizing

Figure 3:
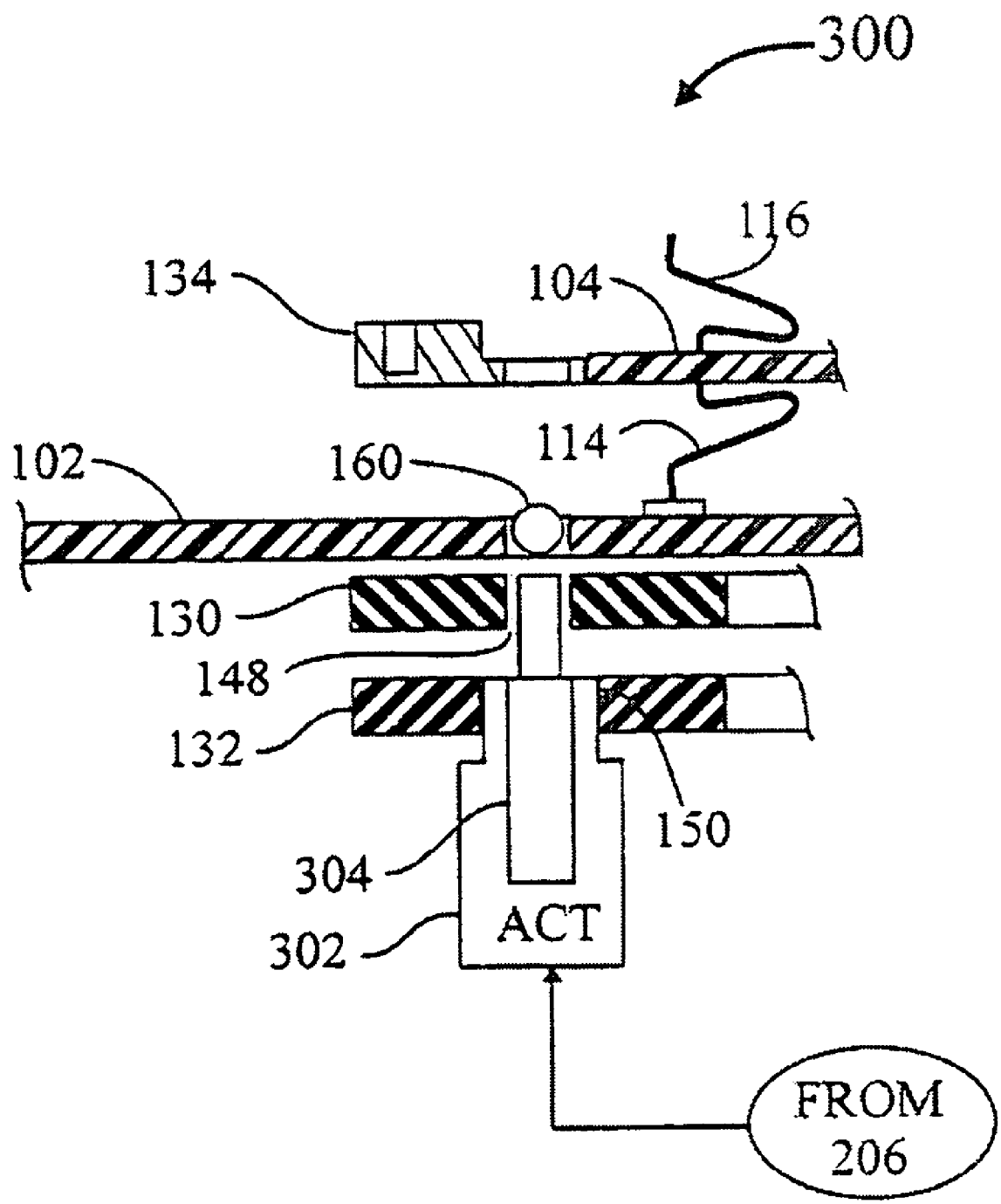
FIG. 3 is a view, partially in cross-section, and partially-schematic, of a technique for automatically adjusting the orientation of the space transformer component, such as is disclosed in the aforemetioned U.S. patent application Ser. No. 08/554,902 and its counterpart PCT/US95/14844, and illustrates certain techniques which are relevant to the present invention.

The aforementioned U.S. patent application Ser. No. 08/554,902 and its counterpart PCT/US95/14844 disclose an alternate (i.e., to the differential screws etc.) mechanism for aligning the probe card assembly. FIG. 3 of this patent application corresponds generally to FIG. 7A of those applications.

FIG. 3 illustrates an automated technique 300 for adjusting the spatial orientation of the space transformer (not shown in this view). In this example, an actuator mechanism 302 (labelled "ACT") is substituted for the differential screws (136, 138) and operates in response to signals from the computer (e.g., 206). Three such mechanisms 302 can be substituted for the three pairs of differential screw elements in a straightforward manner. Similar elements in FIG. 3 are labelled with identical numbers as appear in FIG. 2, and several elements appearing in FIG. 2 are omitted from the view of FIG. 3, for illustrative clarity.

It is also within the scope of this invention that the mechanism (particularly an automated mechanism as illustrated in FIG. 3) for planarizing the space transformer (106) can be disposed other than as shown in the exemplary embodiments described herein. For example, a suitable mechanism could be located between the top (as viewed) surface of the probe card (102) and the front mounting plate (134), or incorporated into the front mounting plate (134). The key feature of using any of these mechanisms is the ability to alter the angle (orientation) of the space transformer (e.g., 106) without requiring the orientation of the probe card (102) to be altered.

As used herein, the term "resilient", as applied to contact structures, implies contact structures (interconnection elements) that exhibit primarily elastic behavior in response to an applied load (contact force), and the term "compliant" implies contact structures (interconnection elements) that exhibit both elastic and plastic behavior in response to an applied load (contact force). As used herein, a "compliant" contact structure is a "resilient" contact structure. The composite interconnection elements of the present invention are a special case of either compliant or resilient contact structures.

It is within the scope of the invention, and is generally preferred, that although the interconnection elements 514 and 516 are illustrated in FIG. 5 as single interconnection elements, each illustrated element is readily implemented as an interconnection structure having two or more interconnection elements in the manner described hereinabove with respect to FIG. 3A, to ensure that reliable pressure contacts are made to the respective contact terminals 510 of the probe card 502 and contact pads 520 of the space transformer 506.

Mounting the Probe Elements to Silicon

As mentioned hereinabove, the use of a space transformer component (106) in the probe card assembly (100) raises some challenges. For example, when making connections to semiconductor devices to operate them (i.e., burn-in and/or test), the devices will generate heat and expand according to a given coefficient of thermal expansion. Thus, although it is desirable to have a space transformer component that has a coefficient of thermal expansion closely matching that of the silicon device(s), it would be preferable to have the probe elements (124) mounted to and extending from a substrate that has a coefficient of thermal expansion which exactly matches that of the silicon devices being operated.

According to the invention, the probe elements (124) are mounted to and extend from a silicon substrate having a coefficient of thermal expansion which substantially exactly matches that of a wafer (108) being contacted.

Thus, it is within the scope of this invention that the space transformer itself (106) is fabricated from a silicon wafer and provided, if need be, with a rigid backing substrate (not shown). Also, as it turns out, it is easier and more reliable to mount certain types of free-standing elongate interconnectin elements to a silicon substrate than to a ceramic substrate such as a conventional space transformer. For example, the "composite interconnection elements" discussed hereinabove.

It is, however, preferred to take advantage of a silicon substrate carrying the probe elements to make beneficial modifications to the overall probe card assembly.

Figure 4:
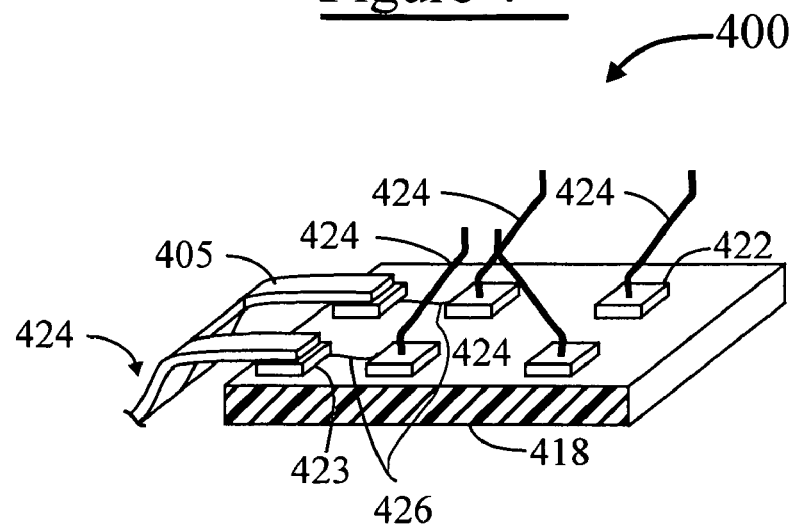
FIG. 4 is a perspective view of a probe card insert, accoridng to the invention.
Figure 4A:
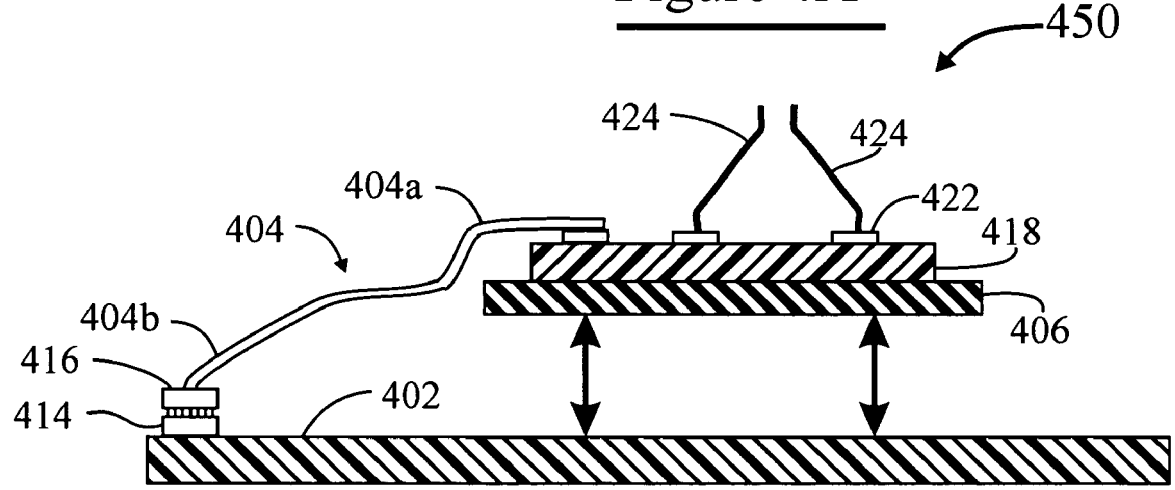
FIG. 4A is a side schematic view of a probe card assembly employing the probe card insert of FIG. 4, according to the invention.

FIGS. 4 and 4A illustrate a probe card insert 400 and probe card assembly 450 employing the probe card insert 400, respectively. Generally, instead of using a space transformer (106), in this embodiment the resilient (spring) interconnection (probe) elements 424 (compare 124) are mounted to and extend from a first plurality (four of many shown in FIG. 4, two of the four shown in FIG. 4A) of terminals 422 (compare 122) of an interconnection substrate 418 (compare 118) which such as a piece of or an entire silicon wafer. Also, instead of making electrical connections from the probe card 402 (compare 102) to the probe elements 424 via the intermediary of an interposer (104), electrical connections are made from the probe card 402 to the probe elements 424 via a flexible ribbon-like conductor 404.

The flexible ribbon-like cable 404 has two ends 404a and 404b. The first end 404a is connected to a second plurality (two of many shown in FIG. 4, one of the two shown in FIG. 4A) of terminals 423 disposed on the interconnection substrate 418. The second end 404b is connected to the probe card 402, suitably by a plug 416 at the end 402b of the cable 404 which mates with a corresponding socket 414 which is mounted to the probe card 402 (or vice-versa).

One having ordinary skill in the art to which this invention most nearly pertains will recognize that each of the terminals 423 are readily interconnected via (e.g., within) the substrate 418 with corresponding ones of the terminals 422. Traces 426 connect corresponding ones of terminals 423 and terminals 422. One skilled in the art will recognize that such traces can be fabricated using any number of well known semiconductor manufacturing techniques to form traces that are below, on or above the surface of substrate 418. Compare FIG. 2 and the connection elements within space transformer 106.

As best viewed in FIG. 4, there are a plurality (two of many shown) of conductive lines (fingers) 405 extending from the first end 404a of the cable 404. These 405 are suitably ribbon-like conductors and, in the manner of tape automated bonding (TAB) are readily bonded to the respective terminals 423. Also, the cable 404 is readily made to have controlled impedance, being provided with additional conductors (not shown) which are connected to ground.

As illustrated schematically by the pair of two-headed arrows in FIG. 4A, there is preferably provided means for controlling the orientation (e.g., planarity) of the interconnection substrate 418 with respect to the probe card 402. This means is suitably similar to the means for controlling orientation described hereinabove with respect to FIG. 1. Taking into account the inherent fragility of a silicon substrate 418, there is preferably provided a rigid backing (support) member 406 for the silicon substrate 418. The support member 406 is suitably a plate of metal, such as brass or steel, and is sufficiently strong (e.g., stiff and thick) to prevent the silicon substrate 418 from flexing when the probe card assembly is urged against a WUT (not shown).

As mentioned above, the interconnection substrate 418 is preferably silicon, to exactly match the coefficient of thermal expansion of the WUT (not shown, see 108 in FIG. 1).

When silicon is used for the interconnection substrate 418, it is readily provided with active devices, such as field effect transistors (FETs), using conventional semiconductor processing techniques. In this manner, for example, when simultaneously (i.e., in one touchdown) probing a plurality of memory devices on a WUT and it is determined that a one of the plurality has failed (e.g., is shorted out), the "bad" device under test (DUT) can be shut down.

Silicon (418) offers additional advantages over ceramic (418) for the substrate to which the probe elements (124, 424) are mounted. It generally has lower series resistance. And it offers more routing (e.g., from the terminals 423 to the terminals 422) flexibility.

As described hereinabove, the electrical function of the interposer (104) has been "replaced" by the cable 404. However, it will be recalled that the interposer (104) also worked in concert with the means for orienting the probe card insert, mechanically biasing the substrate of the probe card insert away from the probe card. This mechanical function, shown by the pair of two-headed arrows in FIG. 4A, can be replaced with any suitable means, such as coil springs.

Figure 4B:
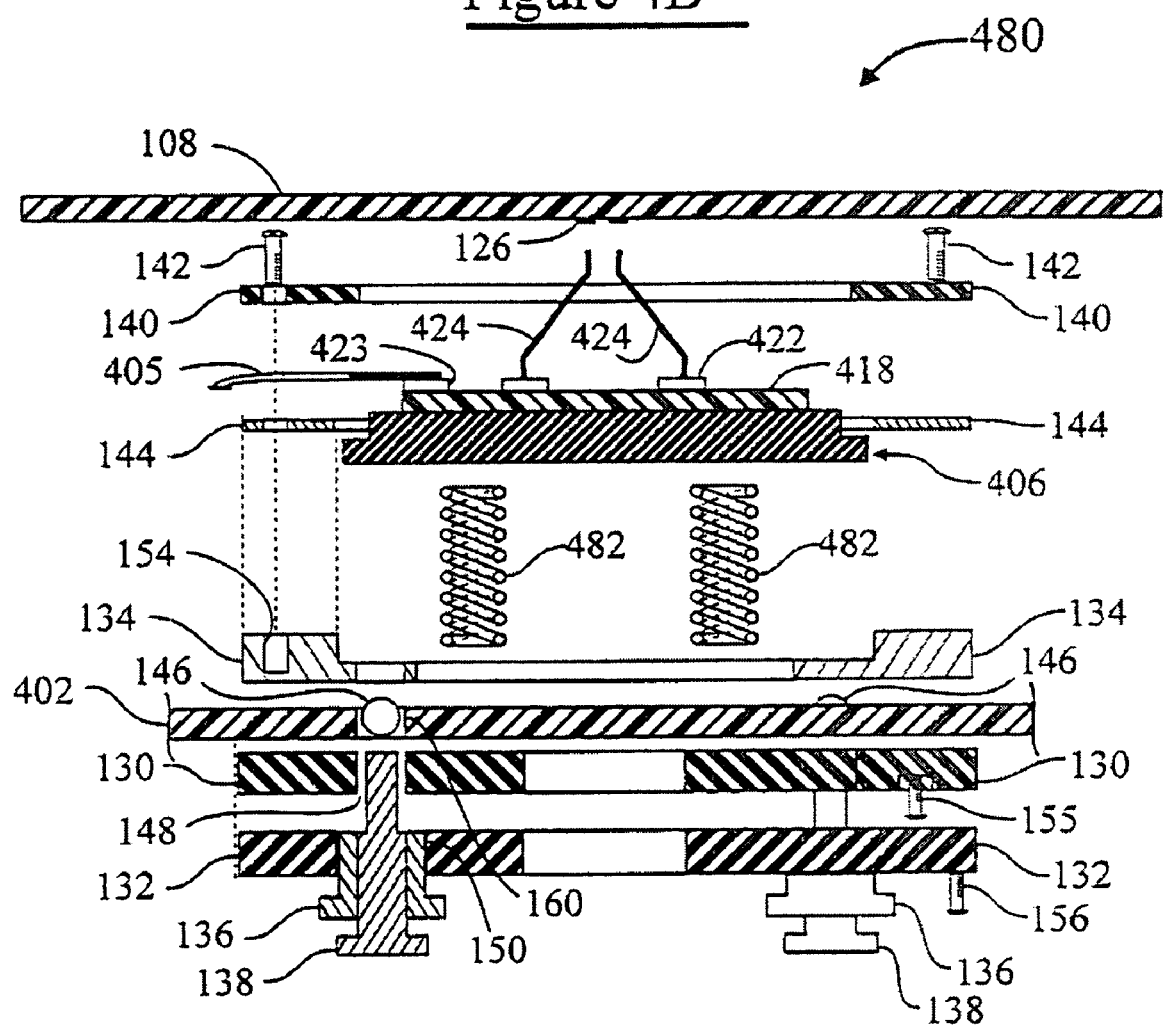
FIG. 4B is an exploded side view, partially in cross-section, of the probe card assembly of FIG. 4A, showing means for adjusting the orientation of the probe card insert of FIG. 4 relative to the probe card component, according to the invention.

FIG. 4B shows an example of a complete probe card assembly 480 assembled in the manner described hereinabove, utilizing differential screws (compare FIG. 1) and three (two visible) simple coil springs 482 between the top (as viewed) surface of the probe card 402 and the bottom (as viewed) surface of the support member 406. As is evident from this figure, the support member 406 can have the same general shape and size as the previously-mentioned space transformer 106, in which case several other elements (i.e., those numbered 1xx) of the previous embodiment 100 can be employed in like manner in the embodiment 480.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein. Several of these variations are set forth in the parent case.

For example, prefabricated contact tip structures are readily joined to the the free ends of the probe elements (424) in the manner described with respect to FIGS. 8A–8E of the aforementioned U.S. patent application Ser. No. 08/554,902 and its counterpart PCT/US95/14844.

For example, it has been suggested hereinabove that the composite interconnection elements of the present invention are but an example of suitable resilient contact structures that can be mounted directly to terminals of a space transformer component of a probe card assembly. For example, it is within the scope of this invention that needles of an inherently resilient (relatively high yield strength) material, such as tungsten, can be coated with a material, such as solder or gold, to make them solderable, optionally supported in a desired pattern, and joined such as by soldering to the terminals (424) of the interconnection substrate (418).

What is claimed is:

1. A probe assembly comprising:
    a wiring board comprising a plurality of contact terminals;
    a semiconductor substrate comprising a plurality of first substrate terminals and a plurality of second substrate terminals, wherein ones of said first substrate terminals are electrically connected to ones of said second substrate terminals;
    a rigid plate, said semiconductor substrate disposed on said rigid plate; and a plurality of electrical connectors connecting ones of said contact terminals to ones of said first substrate terminals.

2. The probe assembly of claim 1 further comprising a plurality of probes mounted to said second substrate terminals.

3. The probe assembly of claim 2, wherein said rigid plate is disposed between said wiring board and said semiconductor substrate.

4. The probe assembly of claim 3, wherein said semiconductor substrate comprises a first side and a second side, opposite said first side, and wherein said first substrate terminals and said second substrate terminals are disposed on said first side of said semiconductor substrate.

5. The probe assembly of claim 4, wherein said second side of said semiconductor substrate is disposed on said rigid plate.

6. The probe assembly of claim 5, wherein said plurality of electrical connectors comprise flexible connectors directly connecting said ones of said contact terminals with said ones of said first substrate terminals.

7. The probe assembly of claim 2, wherein said probes are elongate and resilient.

8. The probe assembly of claim 2 further comprising means for applying a biasing force to said rigid plate, wherein said biasing force biases said semiconductor substrate away from said wiring board.

9. The probe assembly of claim 8 further comprising planarization means for selectively adjusting a planar orientation of contact ends of said probes with respect to said wiring board, said planarization means further holding said semiconductor substrate in said selected planar orientation.

10. The probe assembly of claim 2, wherein said probes are configured to contact an electronic device to be tested, and said semiconductor substrate has a coefficient of thermal expansion that is substantially similar to a coefficient of thermal expansion of said electronic device.

11. The probe assembly of claim 2, wherein said probes are configured to contact terminals of an electronic circuit integrated into a semiconductor material having a composition substantially similar to said semiconductor substrate.

12. The probe assembly of claim 1, wherein said rigid plate is disposed between said wiring board and said semiconductor substrate.

13. The probe assembly of claim 1, wherein said semiconductor substrate comprises a first side and a second side, opposite said first side, and wherein said first substrate terminals and said second substrate terminals are disposed on said first side of said semiconductor substrate.

14. The probe assembly of claim 1, wherein said plurality of electrical connectors comprise flexible connectors directly connecting said ones of said contact terminals with said ones of said first substrate terminals.

15. The probe assembly of claim 1, wherein said semiconductor substrate comprises silicon.

16. The probe assembly of claim 1 further comprising at least one active electronic circuit integrated into said semiconductor substrate.

17. A probe assembly comprising:
a wiring board comprising a plurality of contact terminals;
a semiconductor substrate comprising a plurality of first substrate terminals and a plurality of second substrate terminals, wherein ones of said first substrate terminals are electrically connected to ones of said second substrate terminals, said semiconductor substrate secured without adhesive to said wiring board; and
a plurality of electrical connectors connecting ones of said contact terminals to ones of said first substrate terminals.

18. The probe assembly of claim 17 further comprising a plurality of probes mounted to said second substrate terminals.

19. The probe assembly of claim 18, wherein said semiconductor substrate is secured to a rigid plate, which is secured to said wiring board, wherein said rigid plate is disposed between said wiring board and said semiconductor substrate.

20. The probe assembly of claim 19, wherein said semiconductor substrate comprises a first side and a second side, opposite said first side, and wherein said first substrate terminals and said second substrate terminals are disposed on said first side of said semiconductor substrate.

21. The probe assembly of claim 20, wherein said second side of said semiconductor substrate is disposed on said rigid plate.

22. The probe assembly of claim 21, wherein said plurality of electrical connectors comprise flexible connectors directly connecting said ones of said contact terminals with said ones of said first substrate terminals.

23. The probe assembly of claim 19 further comprising means for applying a biasing force to said rigid plate, wherein said biasing force biases said semiconductor substrate away from said wiring board.

24. The probe assembly of claim 23 further comprising planarization means for selectively adjusting a planar orientation of contact ends of said probes with respect to said wiring board, said planarization means further holding said semiconductor substrate in said selected planar orientation.

25. The probe assembly of claim 18, wherein said probes are elongate and resilient.

26. The probe assembly of claim 18, wherein said probes are configured to contact an electronic device to be tested, and said semiconductor substrate has a coefficient of thermal expansion that is substantially similar to a coefficient of thermal expansion of said electronic device.

27. The probe assembly of claim 18, wherein said probes are configured to contact terminals of an electronic circuit integrated into a semiconductor material having a composition substantially similar to said semiconductor substrate.

28. The probe assembly of claim 17, wherein said semiconductor substrate comprises a first side and a second side, opposite said first side, and wherein said first substrate terminals and said second substrate terminals are disposed on said first side of said semiconductor substrate.

29. The probe assembly of claim 17, wherein said plurality of electrical connectors comprise flexible connectors directly connecting said ones of said contact terminals with said ones of said first substrate terminals.

30. The probe assembly of claim 17, wherein said semiconductor substrate comprises silicon.

31. The probe assembly of claim 17 further comprising at least one active electronic circuit integrated into said semiconductor substrate.

32. A probe assembly comprising:
a wiring board comprising a plurality of contact terminals;
a semiconductor substrate comprising a plurality of first substrate terminals and a plurality of second substrate terminals, wherein ones of said first substrate terminals are electrically connected to ones of said second substrate terminals, there being a space that is at least partially unfilled by solid material between said semiconductor substrate and said wiring board; and a plurality of electrical connectors connecting ones of said contact terminals to ones of said first substrate terminals.

33. The probe assembly of claim 32 further comprising a plurality of probes mounted to said second substrate terminals.

34. The probe assembly of claim 33, wherein said semiconductor substrate is secured to a rigid plate, which is secured to said wiring board, wherein said rigid plate is disposed between said wiring board and said semiconductor substrate.

35. The probe assembly of claim 34, wherein said semiconductor substrate comprises a first side and a second side, opposite said first side, and wherein said first substrate terminals and said second substrate terminals are disposed on said first side of said semiconductor substrate.

36. The probe assembly of claim 35, wherein said second side of said semiconductor substrate is disposed on said rigid plate.

37. The probe assembly of claim 36, wherein said plurality of electrical connectors comprise flexible connectors directly connecting said ones of said contact terminals with said ones of said first substrate terminals.

38. The probe assembly of claim 34 further comprising means for applying a biasing force to said rigid plate, wherein said biasing force biases said semiconductor substrate away from said wiring board.

39. The probe assembly of claim 38 further comprising planarization means for selectively adjusting a planar orientation of contact ends of said probes with respect to said wiring board, said planarization means further holding said semiconductor substrate in said selected planar orientation.

40. The probe assembly of claim 33, wherein said probes are elongate and resilient.

41. The probe assembly of claim 33, wherein said probes are configured to contact an electronic device to be tested, and said semiconductor substrate has a coefficient of thermal expansion that is substantially similar to a coefficient of thermal expansion of said electronic device.

42. The probe assembly of claim 33, wherein said probes are configured to contact terminals of an electronic circuit integrated into a semiconductor material having a composition substantially similar to said semiconductor substrate.

43. The probe assembly of claim 32, wherein said semiconductor substrate comprises a first side and a second side, opposite said first side, and wherein said first substrate terminals and said second substrate terminals are disposed on said first side of said semiconductor substrate.

44. The probe assembly of claim 32, wherein said plurality of electrical connectors comprise flexible connectors directly connecting said ones of said contact terminals with said ones of said first substrate terminals.

45. The probe assembly of claim 32, wherein said semiconductor substrate comprises silicon.

46. The probe assembly of claim 32 further comprising at least one active electronic circuit integrated into said semiconductor substrate.

* * * * *